United States Patent [19]

Kohman et al.

[11] 4,341,582

[45] Jul. 27, 1982

[54] LOAD-LOCK VACUUM CHAMBER

[75] Inventors: Wayne E. Kohman, Wilton; Joseph E. Maleri, Bridgeport, both of Conn.

[73] Assignee: The Perkin-Elmer Corporation, Norwalk, Conn.

[21] Appl. No.: 219,060

[22] Filed: Dec. 22, 1980

[51] Int. Cl.³ ............................................... C23F 1/02
[52] U.S. Cl. .................................... 156/345; 156/643; 156/646; 204/298; 422/186
[58] Field of Search ............... 156/345, 643, 646, 656, 156/657; 250/531; 204/164, 192 EC, 192 E, 298; 414/225, 287, 404, 406, 744 B; 355/18

[56] References Cited

U.S. PATENT DOCUMENTS

| | | | |
|---|---|---|---|
| 4,149,923 | 4/1979 | Uehara et al. | 156/345 |
| 4,208,159 | 6/1980 | Uehara et al. | 414/225 |
| 4,209,357 | 6/1980 | Gorin et al. | 156/643 |

*Primary Examiner*—William A. Powell

*Attorney, Agent, or Firm*—S. A. Giarratana; E. T. Grimes; T. P. Murphy

[57] ABSTRACT

An apparatus for etching one wafer while simultaneously pretreating or stripping another wafer. A module comprises a wafer etching chamber disposed within a larger chamber. The wafer etching chamber is adapted to etch a first wafer during the time that a second wafer is being pretreated in the larger chamber. When the first wafer is etched, it is transferred to the larger chamber and the pretreated second wafer is transferred to the etching chamber. During the time the second wafer is being etched the first wafer is stripped and removed from the larger chamber. A third wafer is introduced into the larger chamber for pretreating while the second wafer is being etched and the process repeated. Once a wafer enters the module for pretreating, etching and stripping, it is not exposed to the atmosphere until stripping is complete.

12 Claims, 4 Drawing Figures

LOAD-LOCK VACUUM CHAMBER

BACKGROUND OF THE INVENTION

The manufacture of integrated circuits involves a large number of steps in which a silicon wafer is coated first with a primary coating, e.g., aluminum and then a photoresist coating. It is then exposed to circuit patterns previously formed on a mask. One such system exposing a silicon wafer to the circuit patterns on a mask is described in U.S. Pat. No. 4,011,011 entitled Optical Projection Apparatus and assigned to the Assignee of the present invention. After exposure the silicon wafer is developed to remove portions of the photoresist leaving an outline of the circuit patterns from the mask. Next, the primary coating of the wafer not covered by the photoresist is etched to expose the silicon wafer surface in patterns determined by the remaining photoresist. The remaining photoresist is then stripped. At this point the silicon may be processed further, e.g., doped by injecting materials into the surface of the silicon wafer to form portions of electrical components such as transistors, diodes etc.

This process is repeated a number of times until complete circuits are built up on the wafer which is then sliced along rows and columns to form a number of identical, individual integrated circuits.

A critical step in this fabrication process is that of etching. In integrated circuit fabrication etching is a technique for the selective removal of material from the wafer. The areas etched are those lines formed by the removal of photoresist.

One method of etching known as wet processing involves the use of chemicals in liquid form which remove the oxide layer on the silicon wafer from areas not covered by the photoresist. This method is highly isotropic.

Another method of etching known as dry processing involves the use of gas in an evacuated chamber containing the wafer. The gas is ionized by an R F source to create ions which attack the coating on those wafer areas or lines not covered by photoresist. Dry processing is less costly, more selective, and easier to control than wet processing. In addition, dry processing is highly anisotropic, has higher yield and is more susceptible to automation than wet processing.

A problem associated with both methods of etching wafers is atmospheric contamination of the photoresist coating on the wafer. Exposure to atmospheric moisture causes a thin top layer of the photoresist coating to deteriorate. This moisture can react with the etching gases or liquids to give undesirable effects.

This problem may be overcome by pretreating the wafer in vacuum immediately prior to etching and thus without further exposure to the atmosphere perform the etching step.

SUMMARY OF THE INVENTION

The present invention relates to an apparatus for pretreating, etching and stripping a silicon wafer within a single module. The module comprises an inner chamber for etching the wafer housed within an outer or load-lock chamber wherein pretreating and stripping of the wafer takes place.

After a wafer has been etched the inner chamber opens and carriage means place the wafer on the lower level of a two level elevator in the load-lock chamber. A wafer on the upper level having been pretreated is transferred to the etching chamber which is then closed and the etching process is begun. The wafer on the lower level is stripped of any remaining photoresist. The lock-load chamber is then purged to atmosphere and the now finished wafer on the lower level of the elevator is transported by the carriage means through the door of the load-lock chamber to air track transportation means which delivers the finished wafer to a storage cassette. Another wafer is then delivered to the upper level of the elevator, the door is closed, the load-lock chamber is evacuated, and the wafer is pretreated. The cycle is repetitive. Once a wafer is inserted into the load-lock chamber which is then evacuated the wafer never sees atmosphere until stripping is complete and the load-lock door is opened to permit the now stripped wafer to be ejected and the wafer to be pretreated to be inserted. The inner chamber never sees atmosphere since it is only opened when the load-lock module is in an evacuated state.

DESCRIPTION

Figure 1:
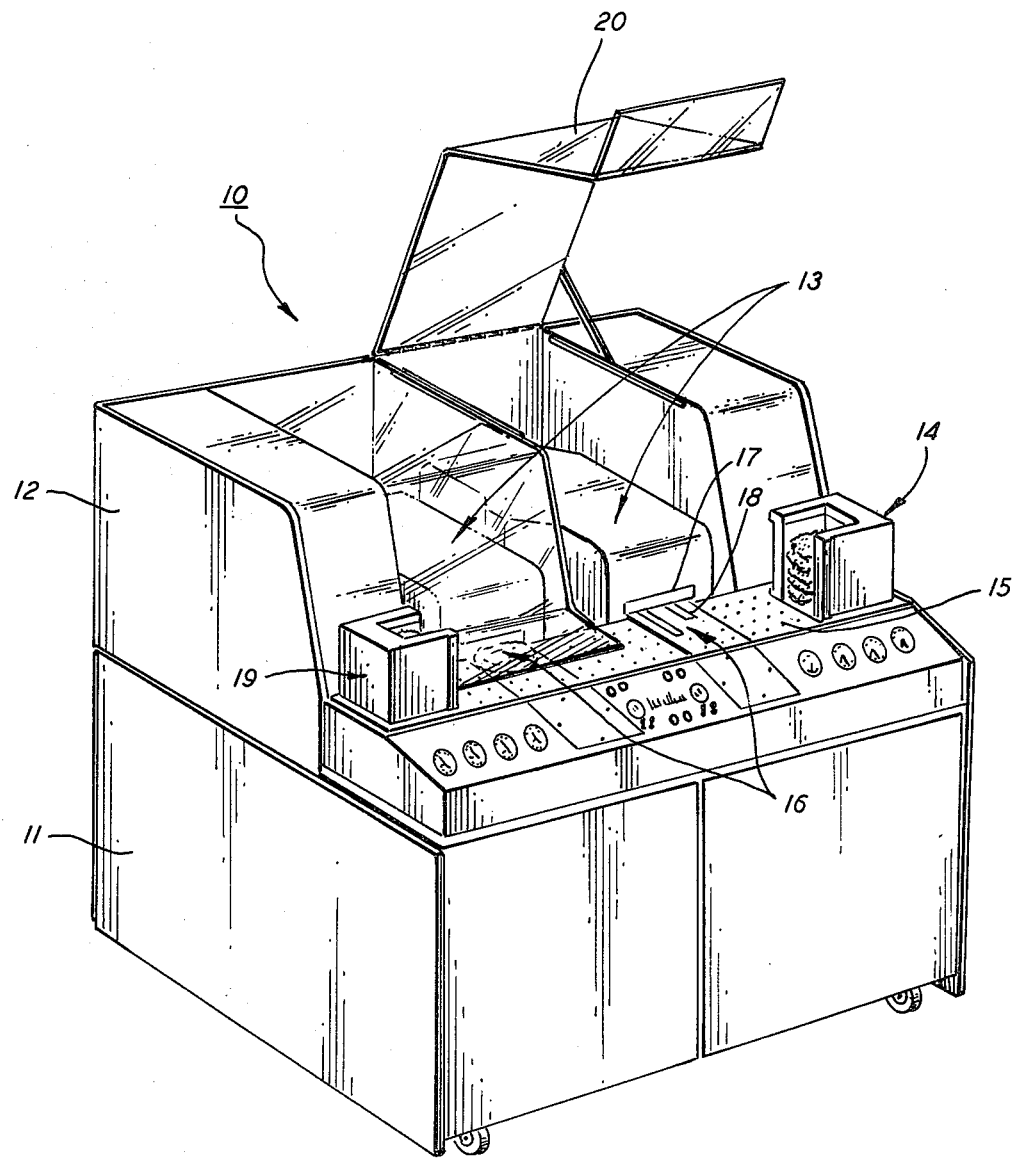
FIG. 1 shows the console incorporating the present invention.

Referring now more particularly to FIG. 1 there is shown a console 10 comprising a base portion 11. The base portion 11 houses the various electrical and pneumatic components which control the operation of the processing system of the present invention.

The upper portion 12 of control 10 is shown as housing two modules 13. However, it should be noted that console 10 may house more modules if desired which, of course, would require a proportionally larger upper portion 12.

A wafer supply elevator 14 delivers wafers one at a time to a selected one of modules 13 via air track 15. The air track 15 delivers wafers to a selected one of prealignment stages 16. After aligment the wafer is inserted into the module via opening 17 by means of a transfer finger 18 associated with each module 13. The transfer finger 18 is flush with the air track 15 and alignment stages 16 so as not to obstruct movement of the wafers. Once aligned, however, the wafer is held by a transfer finger 18 by means of vacuum and inserted into a module. The transfer finger 18 then removes a completely processed wafer from the module and places it on the airtrack where it is transported to wafer take-up elevator 19.

The console 10 may be provided with transparent doors 20, one of which is shown in the open position which cover modules 13 as well as the airtrack 15. This arrangement aids in keeping contaminating dust particles and the like from depositing on the wafer as it is transported.

Figure 2:
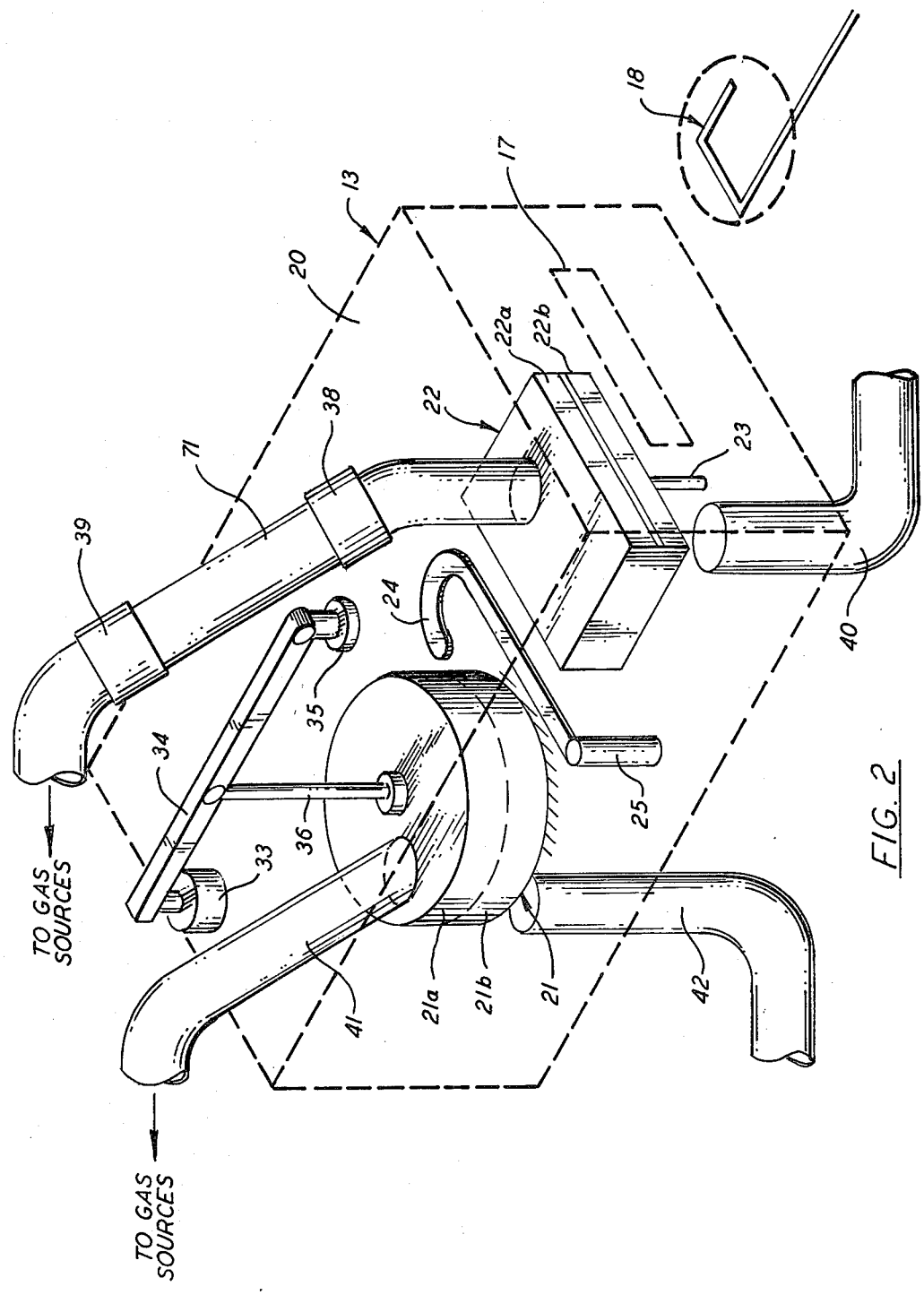
FIG. 2 is a pictorial representation of a module of the present invention.

As seen in FIG. 2 each module 13 comprises an outer chamber 20 hereinafter referred to as the load module 20 and an inner chamber 21 hereinafter referred to as the process module 21.

The load module 20 houses an elevator 22 which contains two shelves 22a and 22b. The elevator 22 is mounted on a shaft 23 which passes through the bottom of load module 20. The elevator 22 is movable via shaft 23 between first and second positions. When elevator 22 is in its first position, shelf 22a is aligned to receive wafers from transfer finger 18. When elevator 22 is in its second position, it is aligned so that transfer finger 18 may retrieve a wafer from shelf 22b.

A swing arm 24 is mounted on shaft 25. Shaft 25 extends through the bottom of load module 20. Swing arm 24 is movable via shaft 25 to fetch a wafer from shelf 22a when elevator 22 is in its first position and place it within process module 21 or to fetch a wafer from process module 21 and place it on the second shelf 22b when elevator 22 is in its second position.

Figure 3:
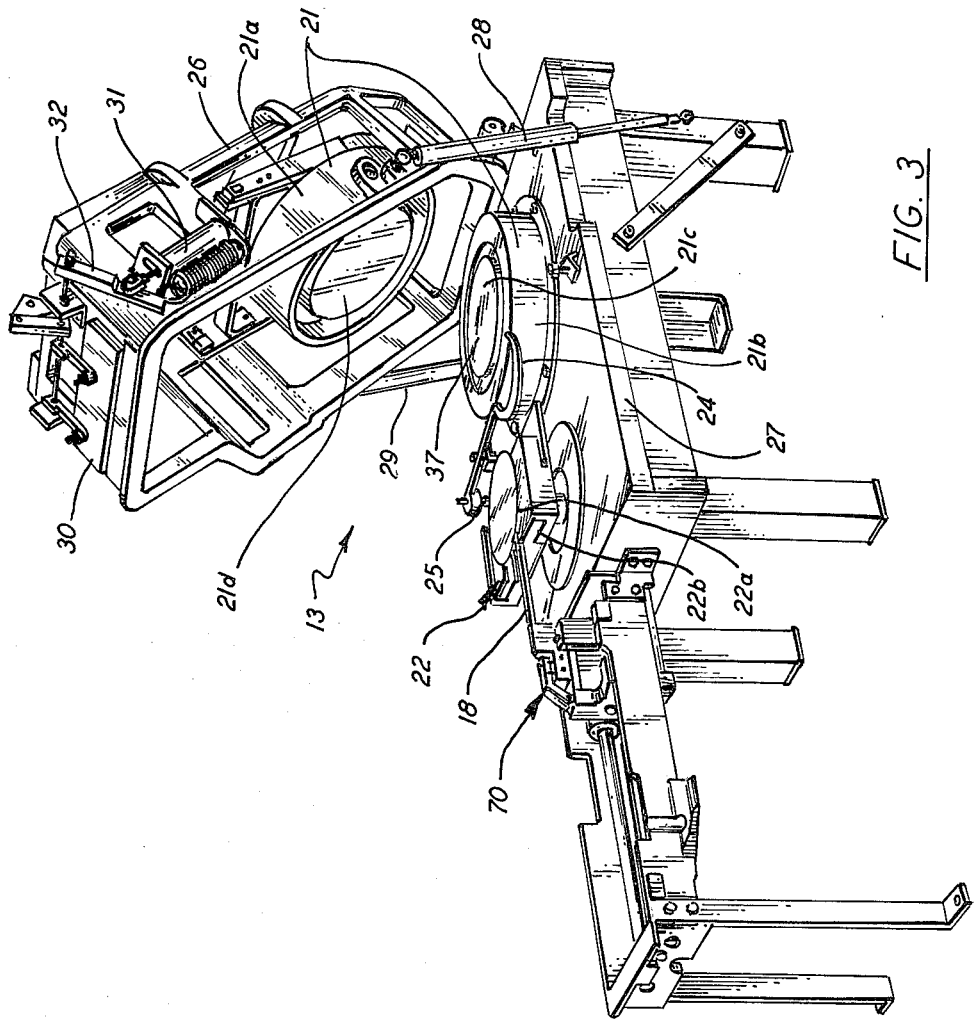
FIG. 3 is a more detailed sectional representation of the present invention.

Referring now to FIG. 3 there is shown a more detailed view of the module 13. The module 13 comprises a top 26 and a base portion 27. The top 26 is shown in the raised position and is partially broken away to provide a view of the internal structure. The top 26 is held in the raised position by gas spring actuators 28 and 29. However, it should be noted that in actual practice the top is in the closed position and is not cutaway so as to form a fluid tight load lock module 20 with base portion 27.

The opening 17 is closed by means of a door 30 which is opened and closed by pneumatic actuator 31 via linkage 32.

Supported on base portion 27 is the elevator 22 having two shelves 22a and 22b.

A transfer carriage 70 having transfer finger 18 inserts wafers through opening 17 onto the upper shelf 22a and removes them from the lower shelf 22b. Door 30 is moved to the open position during transfer of wafers into and out of load module 20.

Process module 21 comprises an upper portion or lid 21a supported by the top 26 of the module 13. Process module 21 also comprises a lower portion 21b supported on base portion 27. Lower portion 22a is a fluid cooled electrode and includes a platform 21c. The upper portion 21a supports a fluid cooled porous electrode 21d through which the etching gases are introduced into process module 21.

As best seen in FIG. 2 process module 21 is normally closed and is opened to receive or give up a wafer. Pneumatic actuator 33 having an arm 34 pivotally fixed to top 26 of the module 13 raises and lowers lid 21a via shaft 36 which is fixed to lid 21a of process module.

As previously explained, the elevator has two levels so that transfer arm 24 may pick off a wafer from the upper shelf 22a and place it on platform 21c or so that transfer arm may pick off a wafer from platform 21c and place it on lower shelf 22b.

Three pins 37 disposed in platform 21c raise the wafer so that the transfer arm 24 can be rotated to a position under the wafer. The pins 37 are then lowered to leave the wafer resting on the transfer arm 28 which transfers it to the lower shelf 22b. When the wafer is transferred to platform 21c, the three pins are raised and lower the wafer to platform 21c after the transfer arm 24 has moved from under the wafer.

Referring again to FIG. 2 there is shown a tube 71 having one end communicating with load module 20 and its other end connected to one or more sources of gases. Electrodes 38 and 39 are disposed on tube 71 and are connected to a source of voltage (not shown). Thus, when gas is being introduced into load chamber 20 and a potential difference is applied over a length of the tube 71 between the electrodes 38 and 39 so that the gas entering load module 20 is ionized to accomplish pretreating or stripping of the wafer on elevator 22.

Also communicating with load module 20 is an exit tube 40 which is connected to means (to be discussed hereinbelow) which exhausts gas from load module 20 and maintains the pressure within the load module at a desired value.

In a similar manner a tube 41 communicates at one end with the volume within process module 21. The other end of tube 41 is connected to one or more sources of etching gases.

Also communicating with process module 21 is an exit tube 42 which is connected to means (to be discussed hereinbelow) which exhausts gas from process module 21 while the pressure within process module 21 is maintained at a desired value.

Figure 4:
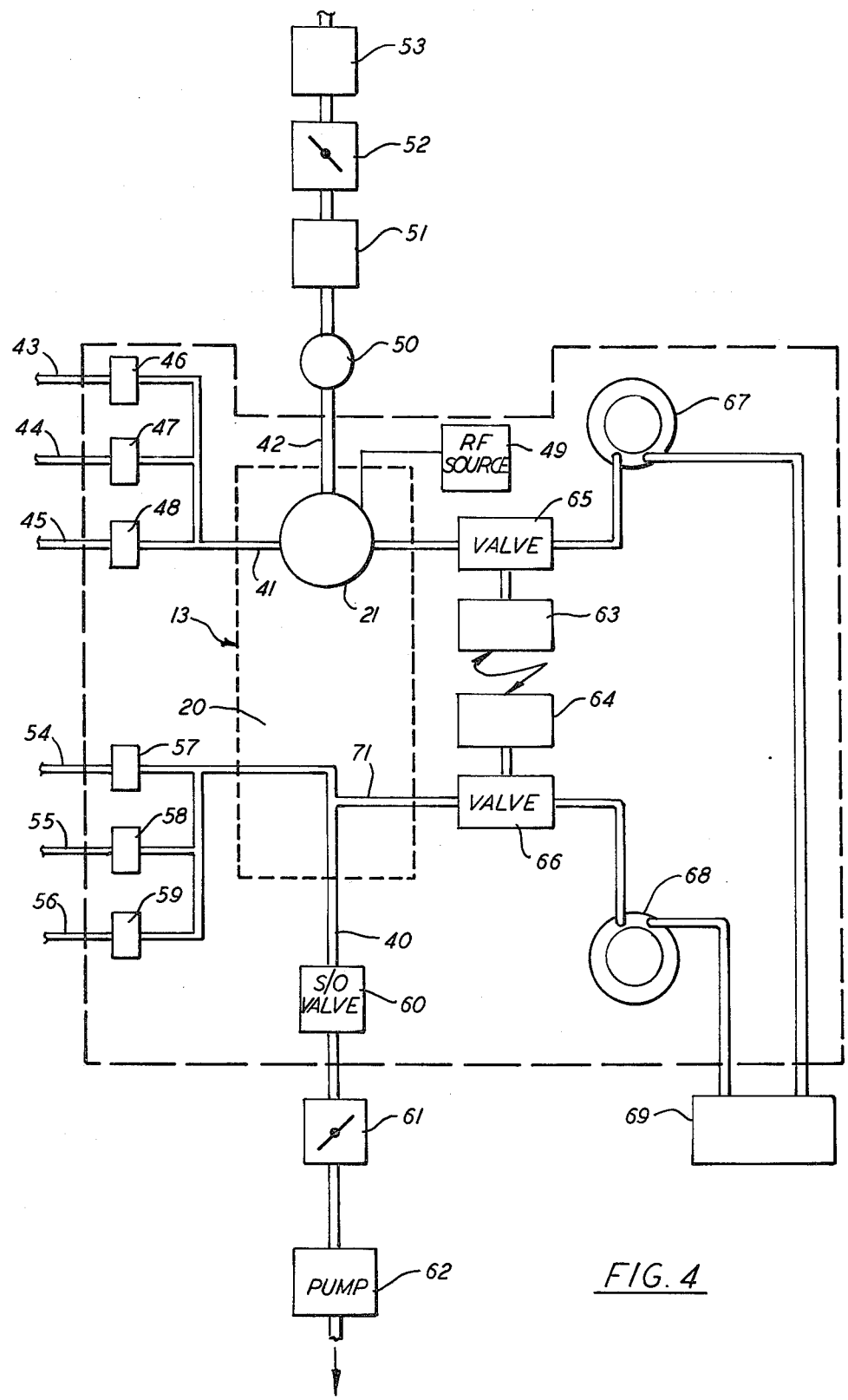
FIG. 4 is a schematic representation of the vacuum and gas supply system used in the present invention.

Referring now to FIG. 4, there is shown the gas supply and exhaust system for each module 13. It should be noted that the system is duplicated for each module 13 in a console.

Tube 41 connects the chamber within process module 21 to one or more sources of etching gas. In a practical embodiment, tube 41 is connected to three incoming lines 43, 44 and 45 via flow controllers 46, 47 and 48 which may be of the type as disclosed in U.S. Patent Application entitled "Molar Gas-Flow Controller" U.S. Ser. No. 223,197 filed Dec. 22, 1980 and assigned to the same assignee as the present application. Any one or combination of gas sources may be connected to process module 21 to deliver etching gases to process module 21 in desired percentages.

Gas in process module 21 is converted to a plasma, i.e., ionized by connecting an RF source of voltage 49 to electrodes 21c and 21d of process module 21.

Exit tube 42 is connected to exhaust the gas to atmosphere via cold trap 50, shut-off valve 51, throttle valve 52 and pump 53.

When pump 53 is operative and shut-off valve 51 is opened, the position of throttle valve 52 controls rate of exit of gas from the process module 21. Cold trap 50 is maintained by any suitable means (not shown) at a temperature sufficiently less than that of the exhausting gases so that contaminates associated with certain types of etching gases precipitate out to prevent damage to pump 53. Pump 53 may be any type of mechanical pump capable of maintaining pressure within process module 21 at a value, e.g., of the order of one Torr suitable for efficient etching.

The load module 20 receives gases from one or more sources. In a practical embodiment the tube 71 of load module 20 is connected to three input tubes 54, 55 and 56 via flow controllers 57, 58 and 59, which functions in a manner similar to flow controllers 46, 47 and 48 to introduce one or more gases to load module in selectable percentages.

Gas from load module 20 is exhausted via shut-off valve 60, throttle valve 61 and pump 62 in a manner similar to that described above in connection with process module 21, i.e., throttle 61 controls the rate of gas exhaustion by pump 62 and therefore pressure within load module 20.

The process module 21 and load module 20 are each monitored by pressure gages 63 and 64, respectively. The pressure gages 63 and 64 must be sensitive enough to measure pressures one Torr or below which is the vacuum range at which it is necessary to keep the load module 20 and process module 21 within during pretreating, stripping and etching. In this way the system may be monitored to assure that pressure within each module is within pressure tolerances before a process step is carried out. In a practical embodiment capacitance manometers, which are highly sensitive at very low pressures are used.

Capacitance manometers 63 and 64 are normally connected to process module 21 and load module 20, respectively, through valves 65 and 66.

However, due to the fact that even capacitance manometers are subject to zero drift, each is zeroed from time to time, e.g., after each etching operation by connecting capacitance manometers 63 and 64 to diffusion pumps 67 and 68 for a brief time by switching valve 65 and 66 to diffusion pumps 67 and 68, respectively. Diffusion pumps 67 and 68 produce a pressure that is less than the lowest pressure that will produce a response on a capacitance manometer. Thus, the reading of a capacitance manometer connected to a diffusion pump is the correction factor which must be subtracted from readings when the capacitance manometer is connected back to the process module 21 or load module 20. A roughing pump 69 is connected to each of diffusion pumps 67 and 68 and is used to bring the pressure in diffusion pumps 67 and 68 to their operative pressures prior to connection to capacitance manometers 63 and 64. This arrangement is more fully set forth in U.S. Application entitled "Auto-Zero System For Pressure Transducer", Ser. No. 203,735 filed Nov. 3, 1980, having the same assignee as the present application.

The present invention may be operated manually or under the control of a microprocessor. However, what has been disclosed is a unique wafer processing apparatus wherein a first wafer is etched while a second wafer is being pretreated or stripped. Thus, due to the load-lock features of the present invention, once a wafer enters the module 31 for processing, it doesn't see atmosphere until it is pretreated, etched and stripped.

Other modifications of this present invention are possible in light of the above description which should not be construed as limiting the present invention beyond those limitations set forth in the claims which follow:

What is claimed is:

1. An apparatus for pretreating, etching and stripping a silicon wafer, comprising in combination;
   a first chamber for treating a wafer,
   a second chamber for treating a wafer disposed within said first chamber,
   first means for inserting or removing a wafer from said first chamber,
   second means for transferring wafers between said first and second chambers.

2. An apparatus according to claim 1 wherein said second chamber comprises,
   electrode means for creating a plasma from an etching gas within said second chamber.

3. An apparatus according to claim 2 wherein said electrode means comprises,
   a first electrode having a flat surface for supporting the wafer,
   a second electrode having a flat surface disposed above said first electrode.

4. An apparatus according to claim 3 wherein said second chamber comprises,
   platform means supporting said first electrode,
   cover means supporting said second electrode,
   said cover means movable to a first position forming an airtight seal with said platform and closing said second chamber and to a second position opening said second chamber.

5. An apparatus according to claim 4 wherein said first chamber comprises,
   elevator means having an upper and lower shelf,
   arm means for transferring a wafer from said first electrode to said lower shelf and from said upper shelf to said first electrode.

6. An apparatus according to claim 5 wherein said first chamber further comprises,
   a base portion supporting said platform means, said elevator means and said arm means,
   a lid portion disposed in an airtight seal with said base portion forming said first chamber.

7. An apparatus according to claim 6 wherein,
   said lid includes an opening through which wafers may pass into and out of said first chamber,
   a door normally closing said opening in an airtight seal,
   third means for opening and closing said door.

8. An apparatus according to claims 4, 5, 6 or 7 including,
   fourth means for moving said cover between said first and second positions.

9. An apparatus according to claim 8 further including,
   sixth means for transporting wafers through said door to and from said elevator means.

10. An apparatus according to claims 5 or 9 wherein said elevator means comprises,
    sixth means for raising and lowering said elevator means so that said lower shelf may be aligned to receive wafers from said first electrode or to deliver wafer from said upper shelf to said first electrode.

11. An apparatus according to claim 10 further comprising,
    seventh means maintaining said second chamber at a predetermined pressure,
    eighth means for flowing etching gas through said second chamber,
    ninth means for generating a plasma of said etching gas in said second ch 12. An apparatus according to claim 11 further comprising,
    tenth means injecting ionized gas into said first chamber for pretreating or stripping the wafer,
    eleventh means maintaining the pressure in said first chamber at a predetermined value.

* * * * *

UNITED STATES PATENT AND TRADEMARK OFFICE
CERTIFICATE OF CORRECTION

PATENT NO. : 4,341,582
DATED : July 27, 1982
INVENTOR(S) : Wayne E. Kohman and E. J. Maleri It is certified that error appears in the above-identified patent and that said Letters Patent is hereby corrected as shown below:

On the title page, "Joseph E. Maleri" should read -- E. Joseph Maleri --.

Claim 11, column 6, line 53, after "gas in said second" "ch" should read -- chamber, --

Signed and Sealed this

Seventh Day of December 1982

[SEAL]

Attest:

GERALD J. MOSSINGHOFF

Attesting Officer

Commissioner of Patents and Trademarks